(12) United States Patent
Li et al.

(10) Patent No.: US 9,548,455 B2
(45) Date of Patent: Jan. 17, 2017

(54) LIGHT EMITTING DIODE

(71) Applicants: Tsinghua University, Beijing (CN); HON HAI PRECISION INDUSTRY CO., LTD., New Taipei (TW)

(72) Inventors: Guan-Hong Li, Beijing (CN); Qun-Qing Li, Beijing (CN); Yuan-Hao Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/983,613

(22) Filed: Dec. 30, 2015

(65) Prior Publication Data

US 2016/0190462 A1    Jun. 30, 2016

(30) Foreign Application Priority Data

Dec. 31, 2014   (CN) .......................... 2014 1 0846889

(51) Int. Cl.
*H01L 33/00*   (2010.01)
*H01L 51/00*   (2006.01)
*H01L 51/50*   (2006.01)
*H01L 29/06*   (2006.01)
*H01L 29/786*  (2006.01)

(52) U.S. Cl.
CPC ....... *H01L 51/0048* (2013.01); *H01L 29/0673* (2013.01); *H01L 29/7869* (2013.01); *H01L 51/5092* (2013.01); *H01L 2251/303* (2013.01); *H01L 2924/12041* (2013.01); *H01L 2924/12044* (2013.01)

(58) Field of Classification Search
CPC ............ H01L 29/7869; H01L 51/0048; H01L 29/0673; H01L 2924/12041; H01L 2924/12044

See application file for complete search history.

(56) References Cited

U.S. PATENT DOCUMENTS

| | | |
|---|---|---|
| 9,171,942 B2 | 10/2015 | Mochizuki et al. |
| 2006/0006377 A1 | 1/2006 | Golovchenko et al. |
| 2008/0017849 A1 | 1/2008 | Yukawa et al. |
| 2009/0200912 A1 | 8/2009 | Ren et al. |
| 2009/0246408 A1 | 10/2009 | Chan et al. |
| 2011/0068324 A1 | 3/2011 | Matsumoto et al. |
| 2012/0280213 A1 | 11/2012 | Gau et al. |

(Continued)

FOREIGN PATENT DOCUMENTS

| | | |
|---|---|---|
| TW | 201246309 | 11/2012 |
| TW | 201306137 | 2/2013 |

*Primary Examiner* — Ngan Ngo
(74) *Attorney, Agent, or Firm* — Zhigang Ma

(57) ABSTRACT

A light emitting diode includes an insulating substrate, a first MgO layer, a semiconductor carbon nanotube layer, a second MgO layer, a functional dielectric layer, a first electrode, and a second electrode. The semiconductor carbon nanotube layer has a first surface and a second surface. The first MgO layer coats entire the first surface. The second surface is divided into a first region and a second region. The first region is coated with the second MgO layer. The second MgO layer is covered by the functional dielectric layer. The second region is exposed. The first electrode is electrically connected to the first region. The second electrode is electrically connected to the second region.

14 Claims, 4 Drawing Sheets

(56) References Cited

U.S. PATENT DOCUMENTS

| | | | |
|---|---|---|---|
| 2012/0302003 A1 | 11/2012 | Shieh et al. | |
| 2014/0091284 A1* | 4/2014 | Feng | H01L 51/5203 257/40 |
| 2016/0079089 A1* | 3/2016 | Koezuka | H01L 21/477 438/104 |
| 2016/0190460 A1* | 6/2016 | Li | H01L 51/0048 257/94 |
| 2016/0190461 A1* | 6/2016 | Li | H01L 51/0048 257/94 |
| 2016/0211431 A1* | 7/2016 | Yang | H01L 33/641 |

* cited by examiner

LIGHT EMITTING DIODE

This application claims all benefits accruing under 35 U.S.C. §119 from China Patent Application No. 201410846889.5, filed on Dec. 31, 2014 in the China Intellectual Property Office, the contents of which are hereby incorporated by reference.

BACKGROUND

1. Technical Field

The present invention relates to a light emitting diode (LED).

2. Description of Related Art

LEDs are semiconductors that convert electrical energy into light. Compared to conventional light sources, LEDs have higher energy conversion efficiency, higher radiance (i.e., they emit a larger quantity of light per unit area), longer lifetime, higher response speed, and better reliability. LEDs also generate less heat. Therefore, LED modules are widely used as light sources in optical imaging systems, such as displays, projectors, and so on.

A typical LED commonly includes an N-type semiconductor layer, a P-type semiconductor layer, an N-type electrode, and a P-type electrode. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes in the P-type semiconductor layer and photons in the N-type semiconductor layer can enter the active layer and combine with each other to emit visible light. However, the material of the semiconductor layer is gallium arsenide, gallium phosphide, silicon carbide, or gallium nitride, thus an active layer is required to be located between the N-type semiconductor layer and the P-type semiconductor layer. The structure is complicate.

What is needed, therefore, is a light emitting diode that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
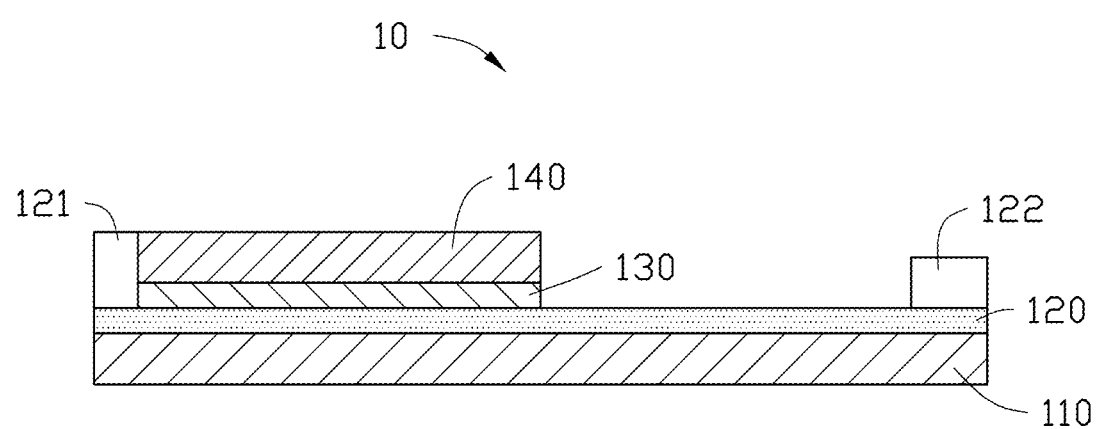
FIG. 1 shows a cross-section view of one embodiment of an LED.

Referring to FIG. 1, one embodiment of a light emitting diode (LED) 10 comprises an insulating substrate 110, a semiconductor carbon nanotube layer 120, an MgO layer 130, a functional dielectric layer 140, and a first electrode 121, and a second electrode 122.

The semiconductor carbon nanotube layer 120, the MgO layer 130, and the functional dielectric layer 140 are stacked on the insulating substrate 110, and the semiconductor carbon nanotube layer is in direct contact with the insulating substrate 110. The MgO layer 130 is located on a portion of the semiconductor carbon nanotube layer 120. The functional dielectric layer 140 is located on the MgO layer 130. The first electrode 121 and the second electrode 122 are electrically connected to the semiconductor carbon nanotube layer 120.

A surface of the semiconductor carbon nanotube layer 120 between the first electrode 121 and the second electrode 122 defines a first portion and a second portion. The first portion is adjacent to the first electrode 121, and the second portion adjacent to the second electrode 122. The first portion and the second portion are aligned side by side along a direction from the first electrode 121 to the second electrode 122. The MgO layer 130 is located on the first portion, and the second portion is exposed. The functional dielectric layer 140 is located on and covers the MgO layer 130.

The insulating substrate 110 is configured as a support. A material of the insulating substrate 110 can be hard material or flexible material. The hard material can be as glass, quartz, ceramics, or diamond. The flexible material can be plastics or resins. The flexible material can also be polyethylene terephthalate, polyethylene naphthalate, polyethylene terephthalate, or polyimide. In one embodiment, the material of the insulating substrate 110 is polyethylene terephthalate. The insulating substrate 110 is used to support the different elements on the insulating substrate 110.

The semiconductor carbon nanotube layer 120 is located on the insulating substrate 110. The semiconductor carbon nanotube layer 120 comprises a plurality of carbon nanotubes. The semiconductor carbon nanotube layer 120 has semi-conductive property. The semiconductor carbon nanotube layer 120 can consist of a plurality of semi-conductive carbon nanotubes. In one embodiment, a few metallic carbon nanotubes can be existed in the semiconductor carbon nanotube layer 120, but the metallic carbon nanotubes cannot affect the semi-conductive property of the semiconductor carbon nanotube layer 120.

The plurality of carbon nanotubes are connected with each other to form a conductive network. The carbon nanotubes of the semiconductor carbon nanotube layer 120 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the semiconductor carbon nanotube layer 120 are arranged to extend along the direction substantially parallel to the surface of the carbon nanotube layer. In one embodiment, all the carbon nanotubes in the semiconductor carbon nanotube layer 120 are arranged to extend along the same direction. In another embodiment, some of the carbon nanotubes in the carbon nanotube layer are arranged to extend along a first direction, and some of the carbon nanotubes in the semiconductor carbon nanotube layer 120 are arranged to extend along a second direction, perpendicular to the first direction.

In one embodiment, the semiconductor carbon nanotube layer 120 is a free-standing structure and can be drawn from a carbon nanotube array. The term "free-standing structure" means that the semiconductor carbon nanotube layer 120 can sustain the weight of itself when it is hoisted by a portion thereof without any significant damage to its structural integrity. Thus, the semiconductor carbon nanotube layer 120 can be suspended by two spaced supports. The free-standing semiconductor carbon nanotube layer 120 can be laid on the insulating layer 104 directly and easily. In one embodiment, the semiconductor carbon nanotube layer 120 can be formed on a surface of insulated support (not shown).

The semiconductor carbon nanotube layer 120 can be a substantially pure structure of the carbon nanotubes, with few impurities and chemical functional groups. The semiconductor carbon nanotube layer 120 can also be composed of a combination of semi-conductive and metallic carbon nanotubes obtained via chemical vapor deposition. The ratio between semi-conductive and metallic of carbon nanotubes is 2:1, and the percentage of the semi-conductive carbon nanotubes is about 66.7% in the combination. In one embodiment, all of the metallic carbon nanotubes can be completely removed via chemical separation method. In another embodiment, most of the metallic carbon nanotubes are removed, and there are a few metallic carbon nanotubes left. Furthermore, the percentage of the semi-conductive carbon nanotubes in the semiconductor carbon nanotube layer 120 ranges from about 90% to about 100%. The semiconductor carbon nanotube layer 120 has good semi-conductive property. In one embodiment, the semiconductor carbon nanotube layer 120 consists of a plurality of single-walled carbon nanotubes. The plurality of single-walled carbon nanotubes are parallel with each other. A diameter of the carbon nanotube is smaller than 2 nanometers. A thickness of the semiconductor carbon nanotube layer 120 ranges from about 0.5 nanometers to about 2 nanometers. A length of the carbon nanotube ranges from about 2 micrometers to about 4 micrometers. In one embodiment, a diameter of the carbon nanotube is greater than 0.9 nanometers and smaller than 1.4 nanometers.

Figure 2:
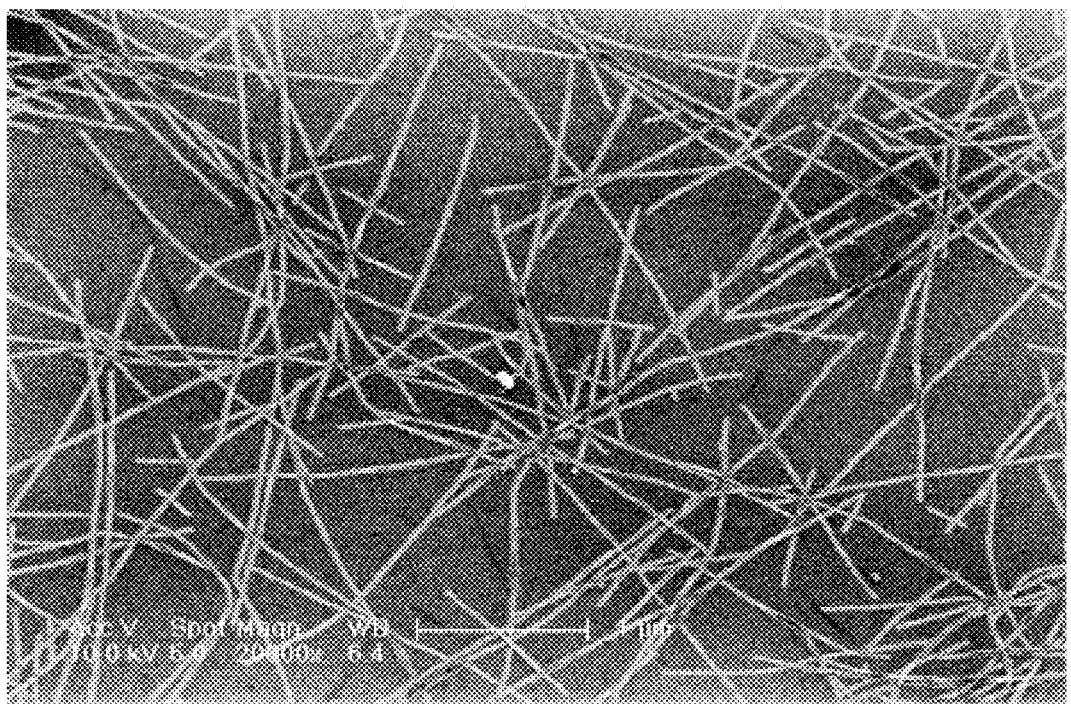
FIG. 2 shows a scanning electron microscope (SEM) view of a semiconductor carbon nanotube film.

Referring to FIG. 2, in one embodiment, the semiconductor carbon nanotube layer 120 consists of the single-walled carbon nanotubes, and the percentage of the semi-conductive carbon nanotubes in the semiconductor carbon nanotube layer 120 is about 98%. The plurality of single-walled carbon nanotubes are entangled with each other to form the conductive network. The diameter of the single-walled carbon nanotube is about 1.2 nanometers. The thickness of the semiconductor carbon nanotube layer 120 is about 1.2 nanometers.

The semiconductor carbon nanotube layer 120 comprises a first surface and a second surface opposite to the first surface. The first surface is in direct contact with the insulating substrate 110, and the MgO layer is located on the second surface. At least 50% of the second surface is covered by the MgO layer 130. The second surface is separated into the first portion and the second portion. The MgO layer 130 and the functional dielectric layer 140 are stacked on the first portion, and the second portion is exposed to the air.

Furthermore, the MgO layer 130 can shield a half of the second surface. The MgO layer 130 is in direct contact with the semiconductor carbon nanotube layer 120. The MgO layer 130 is configured to modulate the first portion of the semiconductor carbon nanotube layer 120, reduce holes, and improve electrons in the first portion of the semiconductor carbon nanotube layer 120. A thickness of the MgO layer 130 can range from about 1 nanometer to about 15 nanometers. In one embodiment, the thickness of the MgO layer 130 ranges from about 1 nanometers to about 10 nanometers. While the thickness of the MgO layer 130 is smaller than 1 nanometer, the MgO layer 130 cannot effectively isolated the air and water molecular from the semiconductor carbon nanotube layer 120, and the structure of LED cannot sustain the stability; while the thickness of the MgO layer 130 is greater than 15 nanometers, the holes in the semiconductor carbon nanotube layer 120 cannot be effectively reduced, and the efficiency of LED will be dramatically reduced. In one embodiment, the thickness of the MgO layer 130 is about 1 nanometer.

The functional dielectric layer 140 is located on the MgO layer 130. In one embodiment, the functional dielectric layer 140 covers entire the MgO layer 130. The term "functional dielectric layer" means that the functional dielectric layer 140 can dope the semiconductor carbon nanotube layer 120 under the affect of the MgO layer 130. Furthermore, the functional dielectric layer 140 is insulating and can isolate the semiconductor carbon nanotube layer 120 from oxygen and water molecular. Thus the semiconductor carbon nanotube layer 120 has N-type property. A material of the functional dielectric layer 140 can be aluminum oxide, hafnium oxide, or yttrium oxide.

In addition, the functional dielectric layer 140 has high density, thus the functional dielectric layer 140 can isolate the air and the water molecular. Furthermore, the functional dielectric layer 140 lacks positive charges, thus the semiconductor carbon nanotube layer 120 can be doped with electrons, and the semiconductor carbon nanotube layer 120 has N-type property. A thickness of the functional dielectric layer 140 can range from about 20 nanometers to about 40 nanometers. In one embodiment, the thickness of the functional dielectric layer 140 ranges from about 25 nanometers to about 30 nanometers. While the thickness of the functional dielectric layer 140 is too small, such as smaller than 20 nanometer, the functional dielectric layer 140 cannot isolate the air and water molecular. In one embodiment, the material of the functional dielectric layer 140 is aluminum oxide, and the thickness is about 30 nanometers.

The first electrode 121 and the second electrode 122 are spaced from each other. The material of the first electrode 121 and the second electrode 122 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the first electrode 121 and the second electrode 122 can comprises Au and Ti. The thickness of the Ti is about 2 nanometers, and the thickness of the Au is about 50 nanometers.

The first portion of the semiconductor carbon nanotube layer 120 has the N-type property, and the exposed second portion of the semiconductor carbon nanotube layer 120 has P-type property. In use, first portion and the second portion forms the P-N junction. While a positive voltage is applied on the P-N junction, the electrons in the first portion will flow toward the second portion, and the holes in the second portion will be injected into the first portion. The holes and the electrons will be recombined to emit light in the semiconductor carbon nanotube layer 120.

The LED has following advantages. The first portion of the semiconductor carbon nanotube layer is coated with the MgO layer and the functional dielectric layer, the function dielectric layer has high density and lack of positive charges, thus the function dielectric layer can provide electrons for the first portion. Then the first portion has great N-type property. The semiconductor carbon nanotube layer is configured as both the N-type semiconductor layer and P-type semiconductor layer, thus the structure of LED is simplified.

Figure 3:
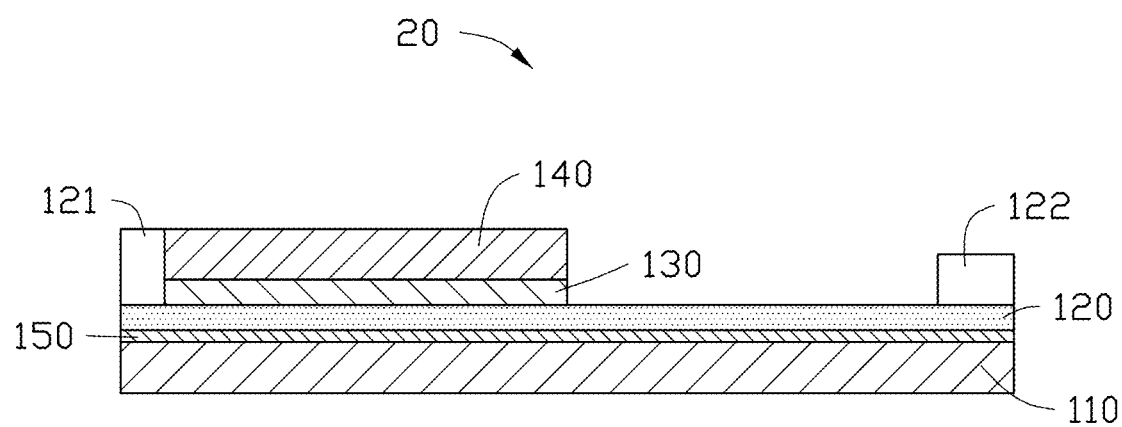
FIG. 3 shows a cross-section view of one embodiment of an LED.

Referring to FIG. 3, one embodiment of a light emitting diode (LED) 20 comprises an insulating substrate 110, a first MgO layer 150, a semiconductor carbon nanotube layer 120, a second MgO layer 130, a functional dielectric layer 140, and a first electrode 121, and a second electrode 122. The first MgO layer 150 is sandwiched between the semiconductor carbon nanotube layer 120 and the insulating substrate 110, and in direct contact with the semiconductor carbon nanotube layer 120.

The structure of the LED 20 is similar to the structure of LED 10, except that the LED 20 further comprises the first MgO layer 150 sandwiched between the semiconductor carbon nanotube layer 120 and the insulating substrate 110. The semiconductor carbon nanotube layer 120 comprises a first surface and a second surface opposite to the first surface. The first surface can be coated with the first MgO layer 150. Furthermore, entire the first surface is coated with the first MgO layer 150. Thus a portion of the semiconductor carbon nanotube layer 120 is sandwiched between the first MgO layer 150 and the second MgO layer 130.

Figure 4:
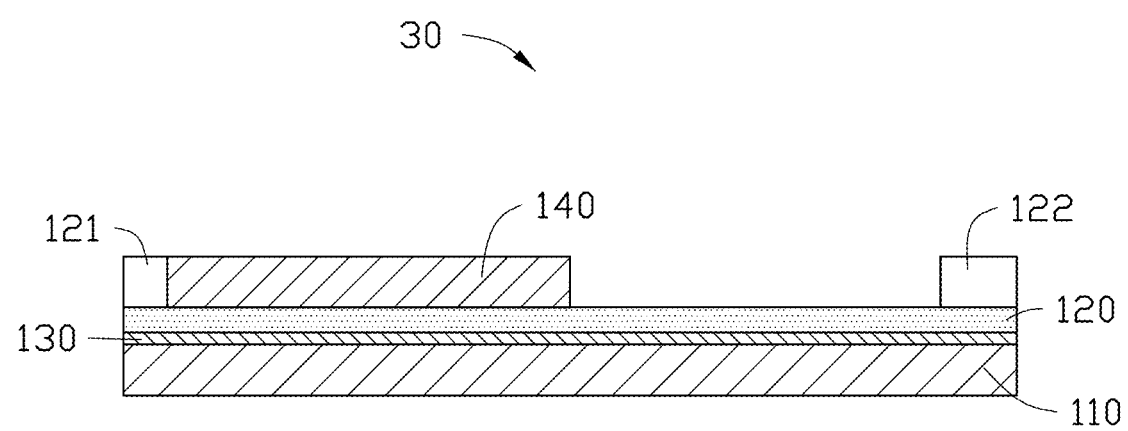
FIG. 4 shows a cross-section view of one embodiment of an LED.

Referring to FIG. 4, one embodiment of a light emitting diode (LED) 30 comprises an insulating substrate 110, an MgO layer 130, a semiconductor carbon nanotube layer 120, a functional dielectric layer 140, and a first electrode 121, and a second electrode 122. The semiconductor carbon nanotube layer 120 is sandwiched between the MgO layer 130 and the functional dielectric layer 140.

The structure of the LED 30 is similar to the structure of LED 10, except that the semiconductor carbon nanotube layer 120 is sandwiched between the MgO layer 130 and the functional dielectric layer 140. The semiconductor carbon nanotube layer 120 comprises a first surface and a second surface. The MgO layer 130 is coated on entire the first surface of the semiconductor carbon nanotube layer 120. The second surface defines a first portion and a second portion. The functional dielectric layer 140 is located on the first portion of the semiconductor carbon nanotube layer 120, and in direct contact with the semiconductor carbon nanotube layer 120. The second portion is exposed.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:

1. A light emitting diode, comprising:
an insulating substrate;
a semiconductor carbon nanotube layer on the insulating substrate; wherein the semiconductor carbon nanotube layer comprises a first surface and a second surface, the first surface is attached to the insulating substrate, and the second surface defines a first region and a second region;
an MgO layer on the first region;
a functional dielectric layer on the MgO layer, wherein the second region is exposed;
a first electrode electrically connected to the first region; and
a second electrode electrically connected to the second region.

2. The light emitting diode of claim 1, wherein the MgO layer is in direct contact with the first region and covers the first region.

3. The light emitting diode of claim 1, wherein a thickness of the MgO layer range from about 1 nanometer to about 15 nanometers.

4. The light emitting diode of claim 1, wherein the semiconductor carbon nanotube layer comprises a plurality of carbon nanotubes.

5. The light emitting diode of claim 1, wherein the semiconductor carbon nanotube layer comprises a plurality of semi-conductive carbon nanotubes connected with each other to form a conductive network.

6. The light emitting diode of claim 5, wherein a percentage of the plurality of semi-conductive carbon nanotubes in the semiconductor carbon nanotube layer is greater than or equal to 66.7%.

7. The light emitting diode of claim 1, wherein the semiconductor carbon nanotube layer consists of a plurality of semi-conductive carbon nanotubes.

8. The light emitting diode of claim 1, wherein a thickness of the semiconductor carbon nanotube layer ranges from about 0.5 nanometers to about 2 nanometers.

9. The light emitting diode of claim 1, wherein the functional dielectric layer is in direct contact with the MgO layer and entirely covers the MgO layer.

10. The light emitting diode of claim 1, where in the MgO layer is sandwiched between the semiconductor carbon nanotube layer and the functional dielectric layer.

11. The light emitting diode of claim 1, wherein a material of the functional dielectric layer is selected from the group consisting of aluminum oxide, hafnium oxide, and yttrium oxide.

12. The light emitting diode of claim 1, wherein a thickness of the functional dielectric layer ranges from about 20 nanometers to about 40 nanometers.

13. The light emitting diode of claim 1, wherein the semiconductor carbon nanotube layer is a free-standing structure.

14. The light emitting diode of claim 1, wherein the first region and the second region are defined at the second surface between the first electrode and the second electrode.

\* \* \* \* \*